(12) United States Patent
Yoon et al.

(10) Patent No.: US 8,159,864 B2
(45) Date of Patent: Apr. 17, 2012

(54) DATA INTEGRITY PRESERVATION IN SPIN TRANSFER TORQUE MAGNETORESISTIVE RANDOM ACCESS MEMORY

(75) Inventors: Sei Seung Yoon, San Diego, CA (US); Seung H. Kang, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 190 days.

(21) Appl. No.: 12/329,849

(22) Filed: Dec. 8, 2008

(65) Prior Publication Data

US 2010/0142260 A1    Jun. 10, 2010

(51) Int. Cl.
    *G11C 11/00* (2006.01)
(52) U.S. Cl. .................. 365/158; 365/171; 365/173
(58) Field of Classification Search .............. 365/158, 365/171, 173
    See application file for complete search history.

(56) References Cited

U.S. PATENT DOCUMENTS

| 7,369,429 B2 | 5/2008 | Tanizaki |
| 7,453,747 B2* | 11/2008 | Abraham et al. ............ 365/201 |
| 7,502,253 B2* | 3/2009 | Rizzo ........................... 365/171 |
| 7,733,729 B2* | 6/2010 | Boeve ........................ 365/210.1 |

| 2007/0109858 A1* | 5/2007 | Conley et al. ............ 365/185.11 |
| 2007/0297219 A1 | 12/2007 | Dittrich et al. |
| 2008/0151608 A1 | 6/2008 | Hosotani et al. |

FOREIGN PATENT DOCUMENTS

| EP | 1251520 A2 | 10/2002 |
| WO | WO2008109772 | 9/2008 |

OTHER PUBLICATIONS

International Search Report—PCT/US2009/066996—International Search Authority, European Patent Office, Apr. 28, 2010.
Hosomi, M. et al.: "A novel nonvolatile memory with spin torque transfer magnetization switching: Spin-RAM," in Int. Electron Devices Meeting (IEDM) Tech. Dig., 2005, pp. 459-462.
Written Opinion—PCT/US2009/066996—International Search Authority European Patent Office—Apr. 28, 2010.

* cited by examiner

*Primary Examiner* — Son Dinh
*Assistant Examiner* — Nam T Nguyen
(74) *Attorney, Agent, or Firm* — Michelle Gallardo; Nicholas J. Pauley; Jonathan T. Velasco (57) ABSTRACT

Systems, circuits and methods for controlling the word line voltage applied to word line transistors in Spin Transfer Torque Magnetoresistive Random Access Memory (STT-MRAM) are disclosed. One embodiment is directed to a STT-MRAM including a bit cell having a magnetic tunnel junction (MTJ) and a word line transistor. The bit cell is coupled to a bit line and a source line. A word line driver is coupled to a gate of the word line transistor. A write-back circuit configured to detect a read value of the bit cell and is configured to write back the read value to the bit cell after a read operation.

20 Claims, 7 Drawing Sheets

PARALLEL MAGNETIZATION
LOW RESISTANCE
STATE "0"

PRIOR ART
FIG. 1A

ANTIPARALLEL MAGNETIZATION
HIGH RESISTANCE
STATE "1"

READ & WRITE

DATA INTEGRITY PRESERVATION IN SPIN TRANSFER TORQUE MAGNETORESISTIVE RANDOM ACCESS MEMORY

FIELD OF DISCLOSURE

Embodiments of the invention are related to random access memory (RAM). More particularly, embodiments of the invention are related to data integrity preservation in Spin Transfer Torque Magnetoresistive Random Access Memory (STT-MRAM).

BACKGROUND

Random access memory (RAM) is a ubiquitous component of modern digital architectures. RAM can be stand alone devices or can be integrated or embedded within devices that use the RAM, such as microprocessors, microcontrollers, application specific integrated circuits (ASICs), system-on-chip (SoC), and other like devices as will be appreciated by those skilled in the art. RAM can be volatile or non-volatile. Volatile RAM loses its stored information whenever power is removed. Non-volatile RAM can maintain its memory contents even when power is removed from the memory. Although non-volatile RAM has advantages in the ability to maintain its contents without having power applied, conventional non-volatile RAM has slower read/write times than volatile RAM.

Figure 1A:
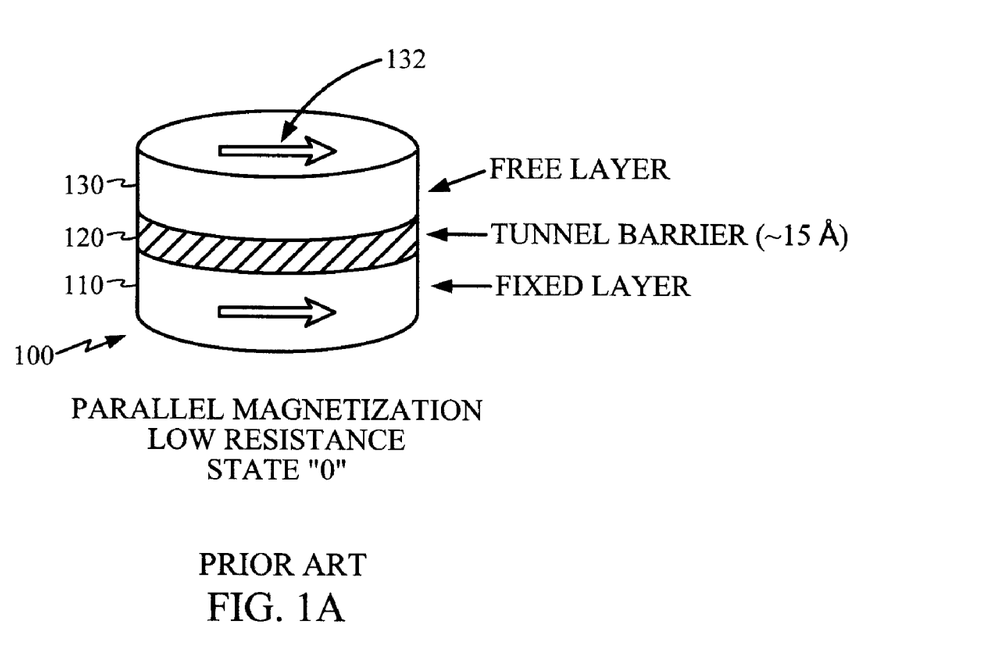
FIGS. 1A and 1B are illustrations of a magnetic tunnel junction (MTJ) storage element.
Figure 1B:
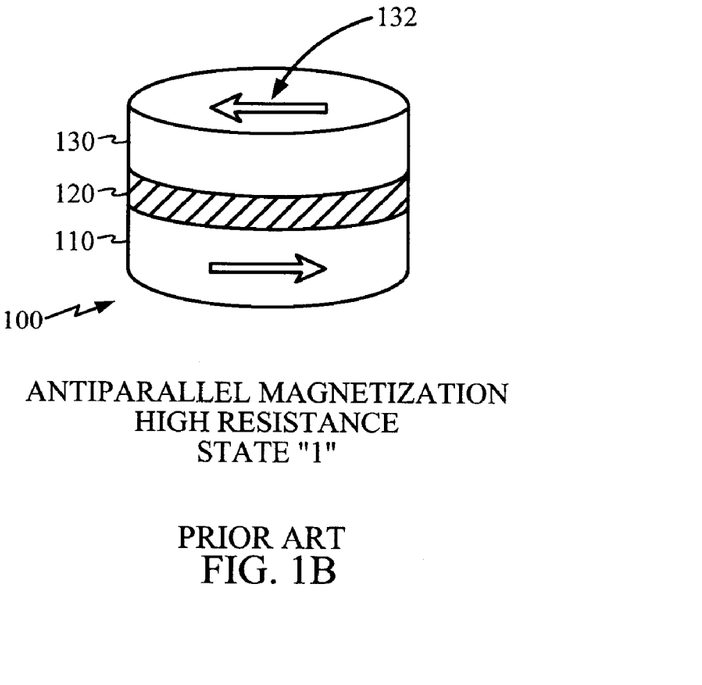

Magnetoresistive Random Access Memory (MRAM) is a non-volatile memory technology that has response (read/write) times comparable to volatile memory. In contrast to conventional RAM technologies which store data as electric charges or current flows, MRAM uses magnetic elements. As illustrated in FIGS. 1A and 1B, a magnetic tunnel junction (MTJ) storage element 100 can be formed from two magnetic layers 110 and 130, each of which can hold a magnetic field, separated by an insulating (tunnel barrier) layer 120. One of the two layers (e.g., fixed layer 110), is set to a particular polarity. The other layer's (e.g., free layer 130) polarity 132 is free to change to match that of an external field that can be applied. A change in the polarity 132 of the free layer 130 will change the resistance of the MTJ storage element 100. For example, when the polarities are aligned, FIG. 1A, a low resistance state exists. When the polarities are not aligned, FIG. 1B, then a high resistance state exists. The illustration of MTJ 100 has been simplified and those skilled in the art will appreciate that each layer illustrated may comprise one or more layers of materials, as is known in the art.

Figure 2A:
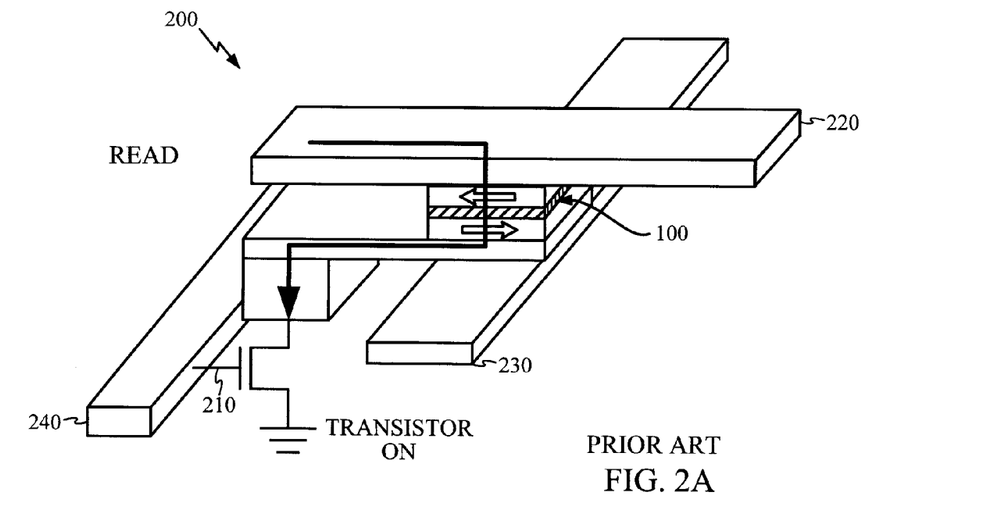
FIGS. 2A and 2B are illustrations of a Magnetoresistive Random Access Memory (MRAM) cell during read and write operations, respectively.

Referring to FIG. 2A, a memory cell 200 of a conventional MRAM is illustrated for a read operation. The cell 200 includes a transistor 210, bit line 220, digit line 230 and word line 240. The cell 200 can be read by measuring the electrical resistance of the MTJ 100. For example, a particular MTJ 100 can be selected by activating an associated transistor 210, which can switch current from a bit line 220 through the MTJ 100. Due to the tunnel magnetoresistive effect, the electrical resistance of the MTJ 100 changes based on the orientation of the polarities in the two magnetic layers (e.g., 110, 130), as discussed above. The resistance inside any particular MTJ 100 can be determined from the current, resulting from the polarity of the free layer. Conventionally, if the fixed layer 110 and free layer 130 have the same polarity, the resistance is low and a "0" is read. If the fixed layer 110 and free layer 130 have opposite polarity, the resistance is higher and a "1" is read.

Figure 2B:
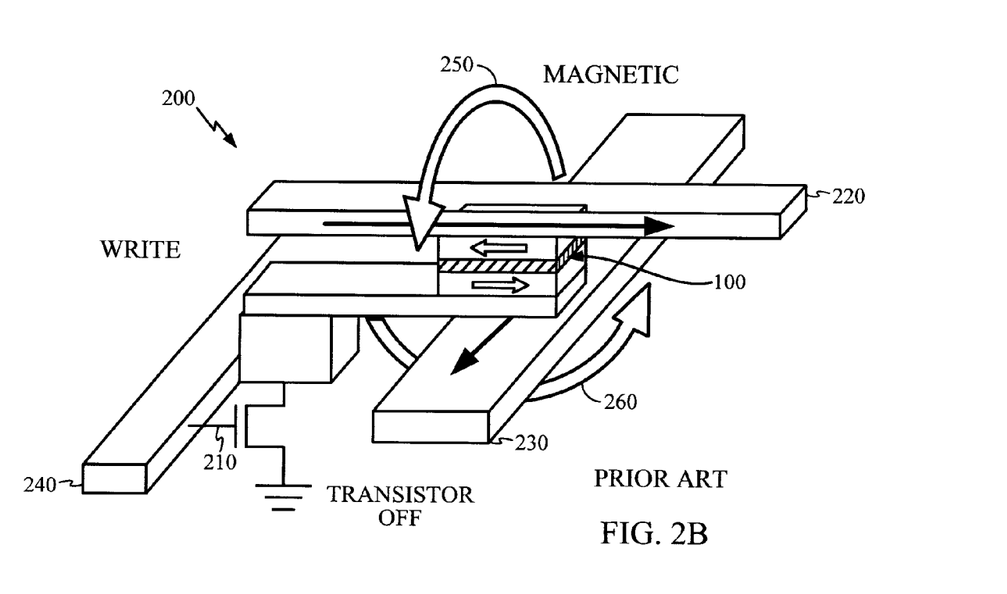

Referring to FIG. 2B, the memory cell 200 of a conventional MRAM is illustrated for a write operation. The write operation of the MRAM is a magnetic operation. Accordingly, transistor 210 is off during the write operation. Current is propagated through the bit line 220 and digit line 230 to establish magnetic fields 250 and 260 that can affect the polarity of the free layer of the MTJ 100 and consequently the logic state of the cell 200. Accordingly, data can be written to and stored in the MTJ 100.

MRAM has several desirable characteristics that make it a candidate for a universal memory, such as high speed, high density (i.e., small bitcell size), low power consumption, and no degradation over time. However, MRAM has scalability issues. Specifically, as the bit cells become smaller, the magnetic fields used for switching the memory state increase. Accordingly, current density and power consumption increase to provide the higher magnetic fields, thus limiting the scalability of the MRAM.

Figure 3A:
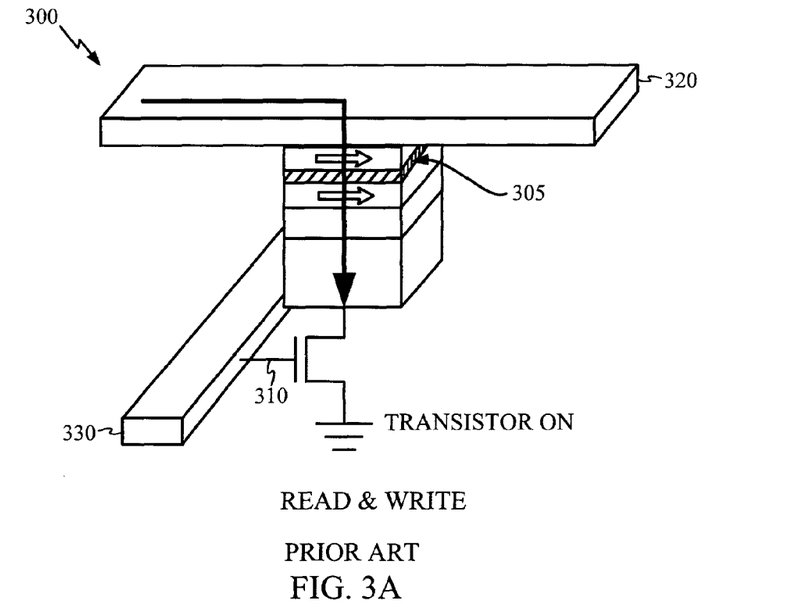
FIGS. 3A and 3B are illustrations of Spin Transfer Torque Magnetoresistive Random Access Memory (STT-MRAM) cells.

Unlike conventional MRAM, Spin Transfer Torque Magnetoresistive Random Access Memory (STT-MRAM) uses electrons that become spin-polarized as the electrons pass through a thin film (spin filter). STT-MRAM is also known as Spin Transfer Torque RAM (STT-RAM), Spin Torque Transfer Magnetization Switching RAM (Spin-RAM), and Spin Momentum Transfer (SMT-RAM). During the write operation, the spin-polarized electrons exert a torque on the free layer, which can switch the polarity of the free layer. The read operation is similar to conventional MRAM in that a current is used to detect the resistance/logic state of the MTJ storage element, as discussed in the foregoing. As illustrated in FIG. 3A, a STT-MRAM bit cell 300 includes MTJ 305, transistor 310, bit line 320 and word line 330. The transistor 310 is switched on for both read and write operations to allow current to flow through the MTJ 305, so that the logic state can be read or written.

Figure 3B:
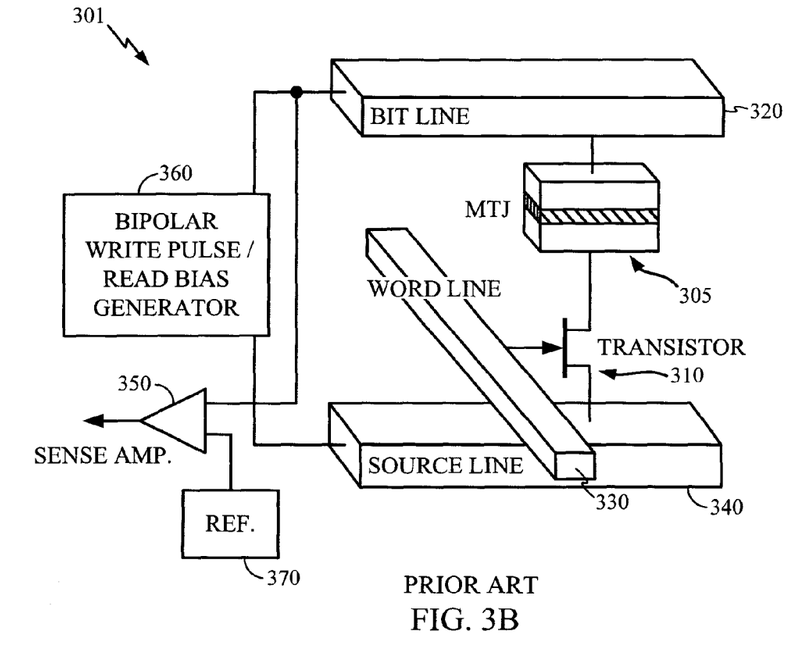

Referring to FIG. 3B, a more detailed diagram of a STT-MRAM cell 301 is illustrated, for further discussion of the read/write operations. In addition to the previously discussed elements such as MTJ 305, transistor 310, bit line 320 and word line 330, a source line 340, sense amplifier 350, read/write circuitry 360 and bit line reference 370 are illustrated. As discussed above, the write operation in an STT-MRAM is electrical. Read/write circuitry 360 generates a write voltage between the bit line 320 and the source line 340. Depending on the polarity of the voltage between bit line 320 and source line 340, the polarity of the free layer of the MTJ 305 can be changed and correspondingly the logic state can be written to the cell 301. Likewise, during a read operation, a read current is generated, which flows between the bit line 320 and source line 340 through MTJ 305. When the current is permitted to flow via transistor 310, the resistance (logic state) of the MTJ 305 can be determined based on the voltage differential between the bit line 320 and source line 340, which is compared to a reference 370 and then amplified by sense amplifier 350. Those skilled in the art will appreciate the operation and construction of the memory cell 301 is known in the art. Additional details are provided, for example, in M. Hosomi, et al., A Novel Nonvolatile Memory with Spin Transfer Torque Magnetoresistive Magnetization Switching: Spin-RAM, proceedings of IEDM conference (2005), which is incorporated herein by reference in its entirety.

The electrical write operation of STT-MRAM eliminates the scaling problem due to the magnetic write operation in MRAM. Further, the circuit design is less complicated for STT-MRAM. However, because both read and write operations are performed by passing current through the MTJ 305, there is a potential for read operations to disturb the data stored in the MTJ 305. For example, if the read current is similar to or greater in magnitude than the write current threshold, then there is a substantial chance the read operation may disturb the logic state of MTJ 305 and thus degrade the integrity of the memory.

SUMMARY

Exemplary embodiments of the invention are directed to systems, circuits and methods for controlling the word line voltage applied to word line transistors in STT-MRAM.

One embodiment is directed to a Spin Transfer Torque Magnetoresistive Random Access Memory (STT-MRAM), comprising: a bit cell having a magnetic tunnel junction (MTJ) and a word line transistor, wherein the bit cell is coupled to a bit line and a source line; a word line driver coupled to a gate of the word line transistor; and a write-back circuit configured to detect a read value of the bit cell and configured to write back the read value to the bit cell after a read operation.

Another embodiment is directed to a method for read and write operations in a (STT-MRAM device. The method comprises: reading data stored in a bit cell having a MTJ and a word line transistor, wherein the bit cell is coupled to a bit line and a source line; detecting a read value of the bit cell; and writing back the detected read value to the bit cell using a word line driver coupled to a gate of the word line transistor.

Another embodiment is directed to a STT-MRAM comprising: means for reading data stored in a bit cell having a MTJ and a word line transistor, wherein the bit cell is coupled to a bit line and a source line; means for detecting a read value of the bit cell; and means for writing back the detected read value to the bit cell using a word line driver coupled to a gate of the word line transistor.

BRIEF DESCRIPTION OF THE DRAWINGS

The accompanying drawings are presented to aid in the description of embodiments of the invention and are provided solely for illustration of the embodiments and not limitation thereof.

DETAILED DESCRIPTION

Aspects of embodiments of the invention are disclosed in the following description and related drawings directed to specific embodiments of the invention. Alternate embodiments may be devised without departing from the scope of the invention. Additionally, well-known elements of the invention will not be described in detail or will be omitted so as not to obscure the relevant details of embodiments of the invention.

The word "exemplary" is used herein to mean "serving as an example, instance, or illustration." Any embodiment described herein as "exemplary" is not necessarily to be construed as preferred or advantageous over other embodiments. Likewise, the term "embodiments of the invention" does not require that all embodiments of the invention include the discussed feature, advantage or mode of operation.

The terminology used herein is for the purpose of describing particular embodiments only and is not intended to be limiting of embodiments of the invention. As used herein, the singular forms "a", "an" and "the" are intended to include the plural forms as well, unless the context clearly indicates otherwise. It will be further understood that the terms "comprises", "comprising", "includes" and/or "including", when used herein, specify the presence of stated features, integers, steps, operations, elements, and/or components, but do not preclude the presence or addition of one or more other features, integers, steps, operations, elements, components, and/or groups thereof.

As discussed in the background, STT-MRAM uses a low write current for each cell, which is an advantage of this memory type over MRAM. However, cell read current can approach or be higher than the write current threshold and thus cause an invalid write operation to occur which may compromise the integrity of the stored data. To reduce the potential of an invalid write, embodiments of the invention use a destructive write-back technique where data read from each memory cell is subsequently written back to that cell. Accordingly, a read cycle includes both a read operation to read the data from a memory cell and a write operation to write the data read from the memory cell back to that cell. Thus, even if an invalid write occurs, data integrity will be preserved. Although the read cycle time may be increased by the additional write operation, STT-MRAM memories implementing a destructive write-back technique according to at least one embodiment of the invention are able to operate at a higher read voltage than STT-MRAM without a write-back feature, and thus may provide a more accurate read value.

Figure 4A:
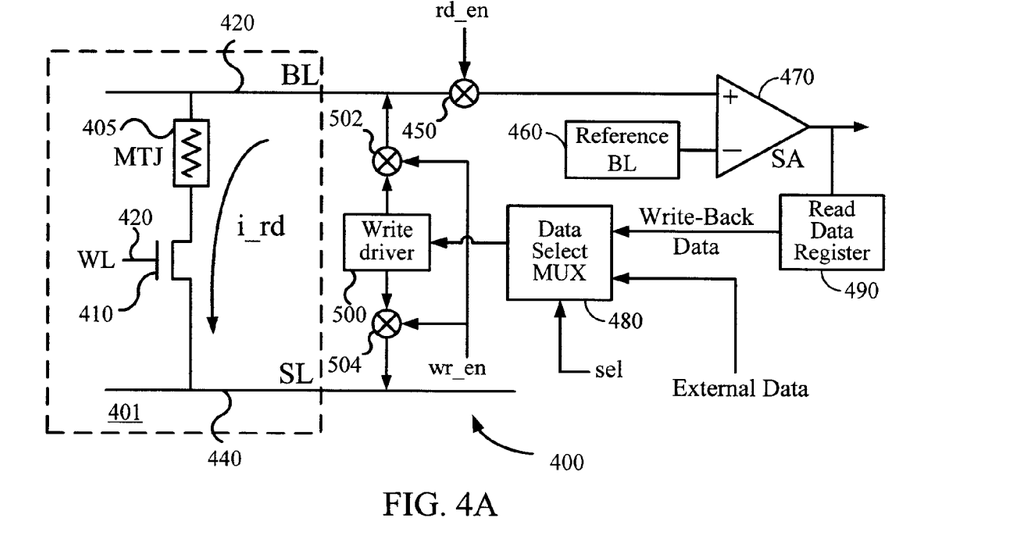
FIGS. 4A and 4B are illustrations of a circuit configuration in a STT-MRAM during read and write operations, respectively.

FIG. 4A illustrates a circuit configuration 400 in a STT-MRAM during a read operation according to an embodiment of the invention. The circuit includes a bit cell 401 including a MTJ 405 and word line transistor 410 coupled between bit line (BL) 420 and source line (SL) 440. Word line transistor 410 is controlled by a word line (WL) 430. A read isolation element 450 is coupled to the bit line 420 to isolate sense amplifier 470 during a write operation. Element 450 (e.g., read mux) can be used to select one of the bit lines during read operation as well as providing sense amplifier isolation. As will be appreciated by those skilled in the art, read isolation element 450 can be any device or combination of devices that can couple the sense amplifier 470 to the bit line 420 during read operations and can isolate sense amplifier 470 during the write operations. For example, the isolation element 450 can be a transmission gate coupled in series with an input of sense amplifier 470. However, those skilled in the art will appreciate that other devices and/or combinations of devices such as multiplexers and the like may be used. Further, those skilled in the art will appreciate that the circuit configuration illustrated herein is merely to facilitate the description of aspects of embodiments of the invention and is not intended to limit the embodiments to the illustrated elements and/or arrangements.

Referring back to FIG. 4A, the isolation element 450 can receive a read enable signal (rd_en) to coordinate with the read operation. A sense amplifier 470 is coupled to the bit line 420 and to a reference 472. Sense amplifier 470 can be used to determine the state of the bit cell 401 by amplifying the voltage differential between the bit line 420 and the reference 472 at the input of the sense amplifier 470 during the read operation. During the read operation transistor 410 is conducting and a read current (i_rd) flows through the MTJ 405. The read isolation element 450 will be conducting and a voltage in proportion to the resistance of the MTJ 405 will be generated and detected at sense amplifier 470. As discussed above, the resistance will vary based on the logic state of the MTJ 405. Accordingly, the data stored in bit cell 401 can be read.

The output of sense amplifier 470 is also fed back to a read data register 490. Read data register 490 temporarily stores the data read from bit cell 401 so that it may be written back to MTJ 405, thereby preserving the data integrity in case of an invalid write operation. Read data register 490 may be implemented with any number of well known data registers, such as a linear shift register, a latch, etc. Read data register 490 outputs the stored read data to a data select multiplexor (MUX) 480. Data select MUX 480 selectively outputs either data from the read data register 490 or data from an external source, depending on the value of a select signal sel. Accordingly, select signal sel controls whether data is written back to bit cell 401 during a read cycle, or whether new external data is written to data cell 401 during a write cycle.

Figure 4B:
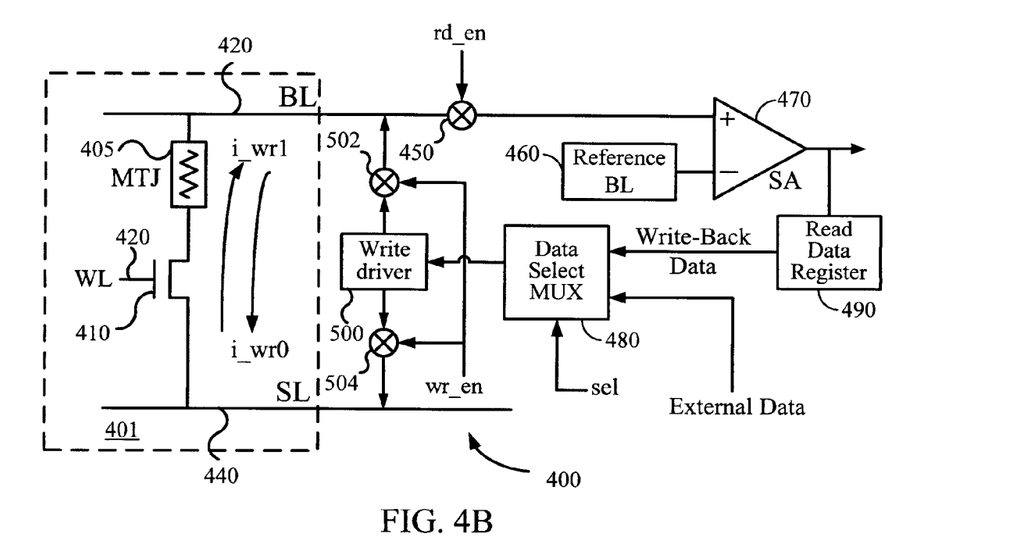

FIG. 4B illustrates the circuit configuration 400 in a STT-MRAM during a write operation according to an embodiment of the invention. As discussed above, the write operation may occur subsequent to a read operation in a read cycle, or may occur as part of an independent write cycle to write external data to bit cell 401, as controlled by select signal sel.

Figure 5:
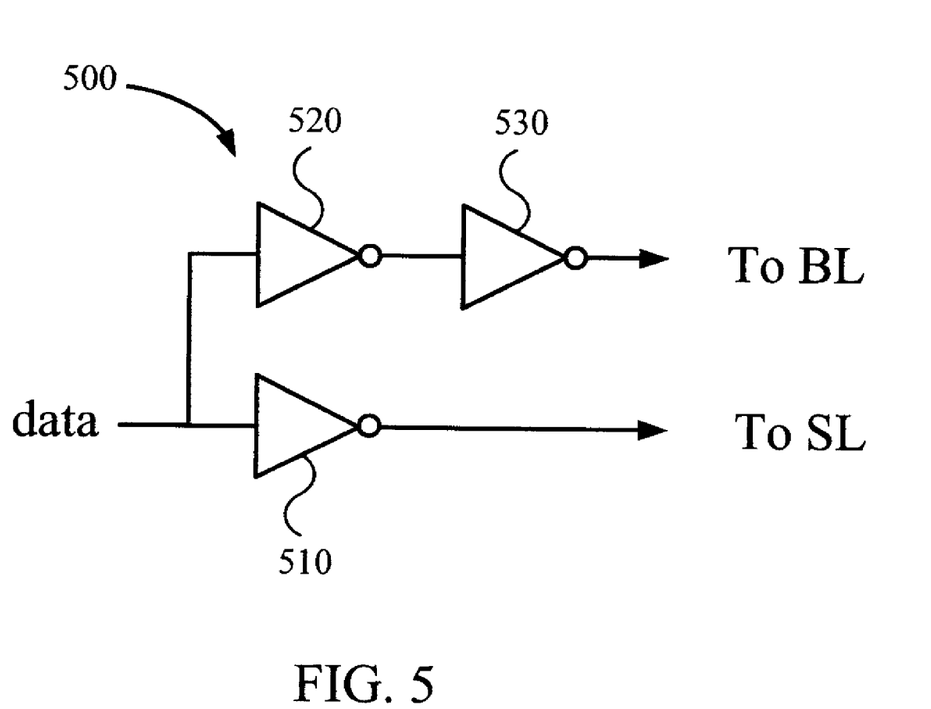
FIG. 5 is an illustration of a circuit configuration for a write driver for a STT-MRAM.

A write driver 500 and write isolation elements 502 and 504 are coupled between the bit line 420 and source line 440 to enable selection of a bit line and writing data to bit cell 401. As discussed above and illustrated in FIG. 4B, in a STT-RAM, passing current through the MTJ 405 can change the polarity of the free layer which in turn changes the resistance of the MTJ 405. This change of resistance can then be detected as a change of logic state of the bit cell 401. For example, a first write current (i_wr0) can flow in a first direction to write a "0" logic state. A second write current (i_wr1) can flow in a second direction opposite to the first direction to write a "1" logic state. The write isolation elements 502 and 504 can be any device or combination of devices that can selectively couple and decouple the write driver 500. For example, the write isolation elements 502 and 504 can be transmission gates coupled in series with the write driver 500. Further, the write isolation elements can receive a write enable signal (wr_en) to coordinate coupling the write driver 500 during the write operation. However, those skilled in the art will appreciate that the write isolation elements 502 and 504 can be other devices and/or combinations of devices such as multiplexers and the like, which can be used to achieve the same functionality. Referring to FIG. 5, a circuit configuration for write line driver 500 is illustrated. The write line driver 500 can include a plurality of inverters 510, 520 and 530 configured to differentially drive the bit line (BL) and source line (SL) based on a received data input that is to be written to the bit cell.

Although not shown, it will be appreciated that circuit configuration 400 can be further controlled by additional control signals received from a system controller or the like, such as a sense amplifier enable signal (SA_en) to activate/deactivate sense amplifier 470, a data-out enable signal (data-out_en) activate/deactivate a data output of bit cell 401, and/ or a data register control signal (data-reg_en) to control read data register 490 to load/store the data read from bit cell 401. Additionally, although not shown for ease of illustration, it will be appreciated that a plurality of bit cells 401 can be combined in rows and columns to form a memory array of arbitrary bit width and size.

Figure 6:
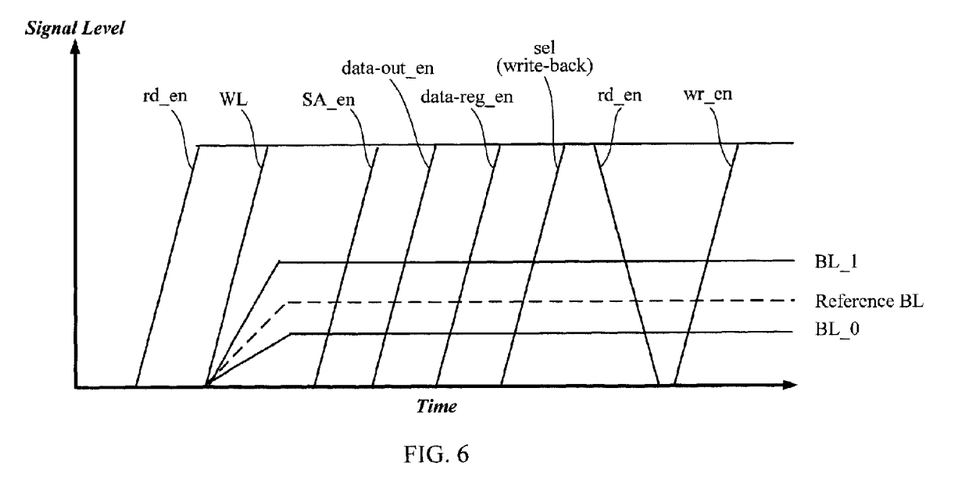
FIG. 6 is a timing diagram illustrating read cycle operations of a STT-MRAM including a write-back feature.

FIG. 6 is a timing diagram illustrating read cycle operations of a STT-MRAM including a write-back feature according to an embodiment of the invention.

As shown, and with reference back to the design of FIGS. 4A and 4B, to initiate a read cycle operation of bit cell 401, rd_en is activated, enabling a read of the data stored in bit cell 401, and the WL is activated, selecting bit cell 401. Once the WL is activated, the BL level is determined by the data stored in bit cell 401, and will have a relatively high signal level BL_1 (as compared to the reference bit line 480) or a relatively low signal level BL_0 (as compared to the reference bit line 480), depending on whether a '1' or a '0' is stored in bit cell 401, respectively. The reference bit line 480 signal level is illustrated in FIG. 6 as a dashed line. SA_en is then activated to enable sense amplifier 470 to detect a read value of bit cell 401. Data-out_en is activated to output the read value detected by sense amplifier 470, providing a data value of bit cell 401 to other parts of the system.

After the read value is output from sense amplifier 470, data-reg_en is activated to load/store the read value into read data register 490. The read value is provided from read data register 490 as the write-back data input to data select MUX 480. Subsequently, sel (write-back) is activated to write-back mode whereby data select MUX 480 outputs the write-back data to write driver 500. Accordingly, rd_en is deactivated to complete the data read portion of the read cycle, and wr_en is activated to initiate the data write portion of the read cycle. Writing back of the data to bit cell 401 then proceeds as a normal write operation, the details of which will therefore be omitted here.

It will be appreciated that sel can be provided by a system controller or the like, or be derived from rd_en or data-reg_en, for example, as the write-back operation is performed subsequent to a corresponding read operation. Similarly, wr_en can also be provided by a system controller or the like, or be derived from rd_en, data-reg_en, sel, etc.

It will also be appreciated that many variations on the signal activation order described above and illustrated in FIG. 6 are possible without disturbing the intended operation of circuit configuration 400. For example, although sense amplifier 470 need not be enabled prior to the WL as no data will be present on the BL, SA_en may nonetheless be activated prior to the WL and circuit configuration 400 will still function properly. Accordingly, the timing diagram of FIG. 6 is provided for illustration purposes only and not intended to be limiting of the particular sequence in which the control signals are activated.

Figure 7:
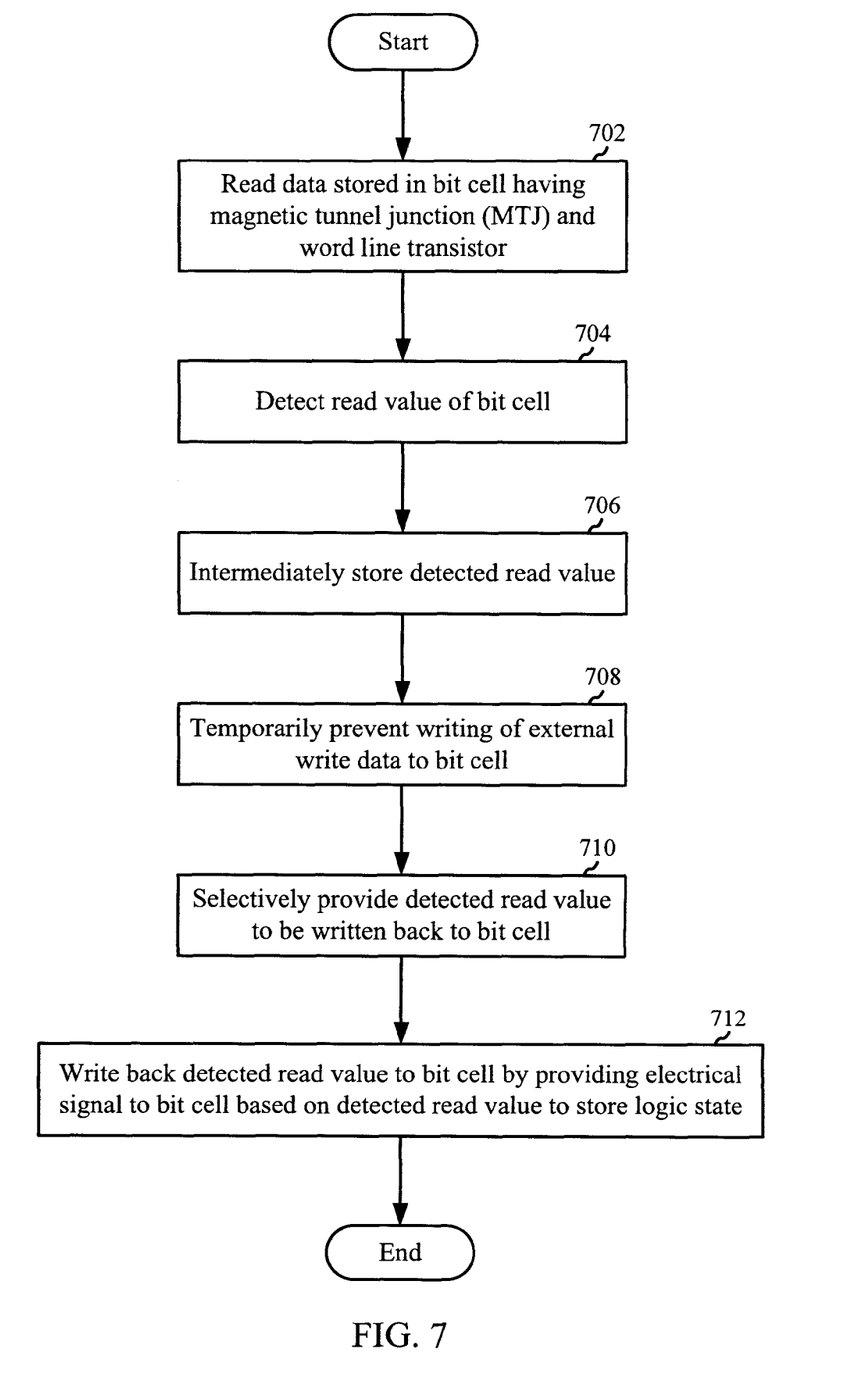
FIG. 7 is a flow diagram for a method for read and write operations in a Spin Transfer Torque Magnetoresistive Random Access Memory (STT-MRAM) device.

In view of the foregoing, it will be appreciated that embodiments of the invention can also include methods for performing the functions, sequence of actions and/or algorithms described herein. For example, FIG. 7 illustrates a flow diagram for a method for read and write operations in a Spin Transfer Torque Magnetoresistive Random Access Memory (STT-MRAM) device according to an embodiment of the invention. As shown, the method may include: reading data stored in a bit cell having a magnetic tunnel junction (MTJ) and a word line transistor, where the bit cell is coupled to a bit line and a source line (block 702); detecting a read value of the bit cell (block 704); intermediately storing the detected read value of the bit cell (block 706); temporarily preventing external write data from being written to the bit cell (block 708);

selectively providing the detected read value to be written back to the bit cell in place of the external write data (block 710); and writing back the detected read value to the bit cell using a word line driver coupled to a gate of the word line transistor by providing an electrical signal to the bit cell to store a logic state in the bit cell, where the electrical signal is based on the detected read value (block 712).

While the foregoing disclosure shows illustrative embodiments of the invention, it should be noted that various changes and modifications could be made herein without departing from the scope of embodiments of the invention as defined by the appended claims. For example, specific logic signals corresponding to the transistors/circuits to be activated, may be changed as appropriate to achieve the disclosed functionality as the transistors/circuits may be modified to complementary devices (e.g., interchanging PMOS and NMOS devices).

Likewise, the functions, steps and/or actions of the methods in accordance with the embodiments of the invention described herein need not be performed in any particular order. Furthermore, although elements of the invention may be described or claimed in the singular, the plural is contemplated unless limitation to the singular is explicitly stated.

What is claimed is:

1. A Spin Transfer Torque Magnetoresistive Random Access Memory (STT-MRAM), comprising:
    a bit cell having a magnetic tunnel junction (MTJ) and a word line transistor, wherein the bit cell is coupled to a bit line and a source line;
    a word line driver coupled to a gate of the word line transistor; and
    a write-back circuit configured to detect a read value of the bit cell and configured to write back the read value to the bit cell after a read operation.

2. The STT-MRAM of claim 1, wherein the write-back circuit further comprises:
    a storage element to store the read value of the bit cell.

3. The STT-MRAM of claim 2, wherein the storage element is a data register.

4. The STT-MRAM of claim 2, wherein the write-back circuit further comprises:
    a data select multiplexer coupled to the storage element and configured to switch between write-back data from the storage element and external write data.

5. The STT-MRAM of claim 1, wherein the write-back circuit further comprises:
    a data select multiplexer configured to switch between the read value being written back and external write data.

6. The STT-MRAM of claim 1, further comprising:
    a write driver configured to provide an electrical signal to the bit cell to store a logic state in the bit cell, wherein the electrical signal is based on an input received from the write-back circuit; and
    at least one write isolation element coupled in series with the write driver between the bit line and source line, wherein the write isolation element is configured to isolate the write driver during a read operation.

7. The STT-MRAM of claim 6, wherein the write driver comprises:
    first and second inverters coupled in series between a data input and the bit line; and
    a third inverter coupled in series between the data input and the source line.

8. The STT-MRAM of claim 6, wherein the write-back circuit further comprises:
    a data select multiplexer configured to switch between the read value and external write data and wherein an output of the data select multiplexer is the input received from the write-back circuit.

9. The STT-MRAM of claim 1, further comprising:
    a plurality of bit cells each having a magnetic tunnel junction (MTJ) and a word line transistor, wherein each bit cell is coupled to the bit line and the source line, and wherein the write-back circuit is configured to write back the read value to one of the plurality bit cells after a read operation.

10. A method for read and write operations in a Spin Transfer Torque Magnetoresistive Random Access Memory (STT-MRAM) device, the method comprising:
    reading data stored in a bit cell having a magnetic tunnel junction (MTJ) and a word line transistor, wherein the bit cell is coupled to a bit line and a source line;
    detecting a read value of the bit cell; and
    writing back the detected read value to the bit cell using a word line driver coupled to a gate of the word line transistor.

11. The method of claim 10, further comprising:
    intermediately storing the detected read value of the bit cell.

12. The method of claim 10, further comprising:
    temporarily preventing external write data from being written to the bit cell; and
    selectively providing the detected read value to be written back to the bit cell in place of the external write data.

13. The method of claim 10, wherein writing back the detected read value comprises:
    providing an electrical signal to the bit cell to store a logic state in the bit cell, wherein the electrical signal is based on the detected read value.

14. The method of claim 10, wherein detecting a read value of the bit cell comprises:
    comparing the bit line to a bit line reference; and
    determining a high logic state if the bit line is greater than the bit line reference, else determining a low logic state.

15. A Spin Transfer Torque Magnetoresistive Random Access Memory (STT-MRAM), comprising:
    means for reading data stored in a bit cell having a magnetic tunnel junction (MTJ) and a word line transistor, wherein the bit cell is coupled to a bit line and a source line;
    means for detecting a read value of the bit cell; and
    means for writing back the detected read value to the bit cell using a word line driver coupled to a gate of the word line transistor.

16. The STT-MRAM of claim 15, further comprising:
    means for intermediately storing the detected read value of the bit cell.

17. The STT-MRAM of claim 15, further comprising:
    means for temporarily preventing external write data from being written to the bit cell; and
    means for selectively providing the detected read value to be written back to the bit cell in place of the external write data.

18. The STT-MRAM of claim 15, wherein writing back the detected read value comprises:
    means for providing an electrical signal to the bit cell to store a logic state in the bit cell, wherein the electrical signal is based on the detected read value.

19. The STT-MRAM of claim 15, further comprising:
    means for comparing the bit line to a bit line reference; and means for determining a high logic state if the bit line is greater than the bit line reference, else determining a low logic state.

20. The STT-MRAM of claim 15, further comprising:
a plurality of bit cells each having a magnetic tunnel junction (MTJ) and a word line transistor, wherein each bit cell is coupled to the bit line and the source line, and wherein the means for writing back is configured to write back the read value to one of the plurality bit cells after a read operation.

* * * * *